United States Patent [19]
Sayre et al.

[11] Patent Number: 5,773,988
[45] Date of Patent: Jun. 30, 1998

[54] STANDARD- AND LIMITED-ACCESS HYBRID TEST FIXTURE

[75] Inventors: Tracy L. Sayre, Fort Collins; Robert A. Slutz, Loveland; Leanne C. Pelzel, Boulder, all of Colo.

[73] Assignee: Hewlett-Packard Company, Palo Alto, Calif.

[21] Appl. No.: 741,151

[22] Filed: Oct. 29, 1996

[51] Int. Cl.$^6$ .................................................. G01R 31/02
[52] U.S. Cl. ............................................. 324/761; 324/758
[58] Field of Search .................................... 324/761, 758, 324/754, 755, 158.1

[56] References Cited

U.S. PATENT DOCUMENTS

| | | | |
|---|---|---|---|
| 4,771,234 | 9/1988 | Cook et al. | 324/158 |
| 4,799,007 | 1/1989 | Cook et al. | 324/158 |
| 4,818,933 | 4/1989 | Kerschner et al. | 324/158 |
| 4,935,696 | 6/1990 | DiPerna | 324/158 |
| 4,977,370 | 12/1990 | Andrews | 324/158.1 |
| 5,450,017 | 9/1995 | Swart | 324/754 |
| 5,485,096 | 1/1996 | Aksu | 324/761 |
| 5,493,230 | 2/1996 | Swart et al. | 324/754 |
| 5,506,510 | 4/1996 | Blumenau | 324/754 |
| 5,510,722 | 4/1996 | Seavey | 324/758 |

*Primary Examiner*—Ernest F. Karlsen
*Assistant Examiner*—Anh Phung
*Attorney, Agent, or Firm*—Cynthia S. Baan

[57] ABSTRACT

A hybrid test fixture is described that utilizes long, leaning or vertical test probes, guide plates and limited probe tip travel in order to achieve high-accuracy, fine-pitch probing of limited-access, no-clean test targets. The hybrid test fixture of the present invention also utilizes standard spring probes and long wirewrap posts or long wirewrap wires in order to probe standard-access test targets. The hybrid test fixture of the present invention also utilizes spring probes, a probe-mounting plate, personality pins and an alignment plate in order to couple test targets with multiplexed tester resources. Accordingly, the hybrid test fixture of the present invention is capable of sophisticated in-circuit and functional testing of a loaded-printed circuit board containing both standard-access and limited-access, no-clean test targets. The present invention is also capable of improved probing accuracy, improved no-clean testability and improved fine-pitch probing of limited-access test targets, while at the same time capable of probing of standard-access test targets.

14 Claims, 5 Drawing Sheets

STANDARD- AND LIMITED-ACCESS HYBRID TEST FIXTURE

FIELD OF THE INVENTION

The present invention relates generally to the field of test equipment for testing printed circuit boards, and more particularly to board test fixtures and other mechanical interfaces for electrically interconnecting electronic circuit cards having electronic components and the like to the interface probes of a loaded-board tester.

BACKGROUND OF THE INVENTION

Loaded Board Test Fixtures

After printed circuit boards (PCB's) have been manufactured and loaded with components, and before they can be used or placed into assembled products, they should be tested to verify that all required electrical connections have been properly completed and that all necessary electrical components have been attached or mounted to the board in proper position and with proper orientation. Other reasons for testing printed circuit boards are to determine and verify whether the proper components have been used and whether they are of the proper value. It is also necessary to determine whether each component performs properly (i.e., in accordance with the specification). Some electrical components and electro-mechanical components also may require adjustment after installation.

Loaded-board testing has complex multiplexed tester resources and is capable of probing soldered leads, vias and testpads on loaded boards with topside and bottom side components. Loaded-board testing includes analog and digital tests, such as tests for electrical connectivity, voltage, resistance, capacitance, inductance, circuit function, device function, polarity, vector testing, vectorless testing, and circuit functional testing. Loaded-board testing requires very low contact resistance between the test targets and the fixture components.

Advances in circuit board and electronic component packaging technology have escalated the probe spacing demands placed on loaded-board test equipment. Existing state-of-the-art technology requires loaded-board test equipment capable of accessing test targets which are spaced apart by 50 mils (center to center) or less, where test targets are physical features on a PCB or electronic component which may be probed during testing. One of the greatest challenges faced by loaded-board test equipment manufacturers now and in the future is a high false failure and test malfunction rate caused by physical and electrical contact problems. These problems are exacerbated by existing fixture limitations in probing accuracy, probing pitch (center to center spacing), and surface contamination.

As component and board geometries shrink and become denser, loaded-board testing becomes more difficult using standard fixtures. Existing shortwire, loaded-board fixtures can consistently hit test targets equal to or greater than 35 mils in diameter with equal to or greater than 75-mil pitch. Targets which are smaller or more closely spaced cannot be probed with consistency due to prohibitive component and system tolerance stack-ups.

A variety of test fixtures have heretofore been available for testing loaded boards on test equipment. A device under test (DUT) typically embodies a PCB loaded with electronic components and electronic hardware. FIG. 1 shows a conventional shortwire, loaded-board fixture, which consists of a DUT 108 with outer-layer artwork, a standard 106 or variable 118 tooling pin for alignment, a probe protection plate 104, standard spring probes 120 whose tips 116 exactly correspond to test target locations 110 and 112, spacers 114 to limit the deflection of the DUT under vacuum loading, a probe-mounting plate 102 in which the spring probes 120 are installed, personality pins 100 which are wired to the spring probes 120, and an alignment plate 122 which aligns the wirewrap tails of the personality pins 100 into a regularly spaced pattern so that they can line up with interface probes 124 mounted in the tester (not shown). Note: a spring probe is a standard device, commonly used by the test community, which conducts electrical signals and contains a compression spring and plunger that move relative to the barrel and/or socket when actuated. A solid probe also conducts electrical signals but has no additional parts which move relative to each other during actuation.

During test, the DUT 108 is pulled down by via vacuum or other known mechanical means to contact the tips 116 of the spring probes 120. The sockets of the standard spring probes 120 are wired to personality pins 100, and an alignment plate 122 funnels the long, flexible personality pin tips 126 into a regularly spaced grid pattern. The tips 126 of personality pins 100 contact the interface probes 124 located in the tester (not shown). Once electrical contact between the DUT 108 and the tester is established, in-circuit or functional testing may commence. Hewlett-Packard Company Application Note 340-1 titled "Reducing Fixture-Induced Test Failures," (printed December 1990 and can be obtained from Hewlett-Packard Company in Palo Alto, Calif.), discloses shortwire fixturing and is incorporated herein for all that it teaches. U.S. Pat. No. 4,771,234 titled "Vacuum-Actuated Test Fixture" by Cook et al. discloses a longwire fixture and is incorporated herein for all that it teaches.

FIG. 2 shows one conventional fixture that attempts to address limited-access problems during testing. The term "limited-access" refers to something that cannot easily be reached, or accessed, due to physical restrictions or constraints. For example, a limited-access PCB may contain many targets that are too closely spaced to accurately probe using existing fixture technology. The term "standard-access" refers to that which can be reached, or accessed, using existing fixture technology. The fixture of FIG. 2 consists of a DUT 206 with testpads 208 and 210, a tooling pin 204, a probe protection plate 202, standard spring probes 214 and 216 installed in a probe-mounting plate, and short probes 212 and 220 commonly referred to as "ULTRALIGN" probes (Ultralign is a registered trademark of TTI Testron, Inc.) installed directly in the probe protection plate. Upon actuation, standard spring probes 216 and 214 located in the probe-mounting plate push against the floating plungers of "ULTRALIGN" probes 212 and 220. These short plungers are forced upward to contact test targets 208 and 210, while the sockets 218 and 222 remain fixed within the probe protection plate 202. An "ULTRALIGN" fixture may contain a mixture of spring probes for probing standard-access targets and "ULTRALIGN" probes for probing limited-access targets.

Despite its potential benefits, the "ULTRALIGN" fixture can be expensive and does not probe targets with a pitch of less than 50 mils. An "ULTRALIGN" fixture only permits limited probe travel which may result in poor connectivity between the probes 212 and 220 and the test targets 208 and 210. Also, these probes are costly and require expensive maintenance to replace worn or broken "ULTRALIGN" probes. An example of this type of fixture is disclosed in U.S. Pat. No. 5,510,772 entitled "Test Fixture for Printed Circuit Boards" to Seavey, which is incorporated herein for all that it teaches.

FIG. 3 shows a conventional guided-probe protection plate fixture. Guided-probe protection plates are used in standard loaded-board test fixtures to improve the pointing accuracy of spring probes. These plates contain cone-shaped through-holes which guide, or funnel, the tips of spring probes toward test targets. Such a fixture consists of a probemounting plate 300 with standard spring probes 312 and 314, a guided-probe protection plate 302 with spacers 310 and cone-shaped holes 316 for guiding the spring probes to the test targets 306 and 308 on the DUT 304. Additional manufacturing steps and increased fixture maintenance are required due to increased wear on the probes and the probe protection plate, and generally only narrow probe tip styles can be used. Although probing accuracy is slightly enhanced with this method, targets with center-to-center spacing of less than 75 mils cannot be probed reliably.

Bare Board Test Fixtures

Bare-board testing probes testpads, vias, and plated through holes on bare printed circuit boards only and tests for electrical connectivity and continuity between various test points in the circuits on the printed circuit boards before any components are mounted on the board. A typical bare-board tester contains test electronics with a huge number of switches connecting test probes to corresponding test circuits in the electronic test analyzer.

While loaded-board testing can determine an electronic component's existence, proper orientation, or functionality, bare-board testing only checks for electrical continuity on PCB's without components. Bare-board testing does not require the very low contact resistance that loaded-board testing requires, nor does bare-board testing utilize sophisticated and complex multiplexed testhead resources which must be assigned to specific targets and circuits on the device under test.

In previous years, PCB's were designed and manufactured so that their features resided in a regularly spaced pattern. During testing, the PCB was placed directly atop a regularly spaced pattern of interface probes located in the tester. As PCB and component geometries shrunk, PCB features could no longer be placed in a regularly spaced pattern and probed directly by interface probes. A bare-board fixture was developed which utilized long, leaning solid probes to provide electrical connections between small, closely spaced, randomly located targets on the PCB and regularly spaced interface probes located in the tester. Circuit Check, Inc. (Maple Grove, Minn.), Everett Charles Technologies (Pomona, Calif.), and Mania Testerion, Inc. (Santa Ana, Calif.), among others, make bare-board test fixtures which are commonly used on bare-board testers today.

Although each bare-board fixture builder uses unique components and manufacturing processes, most bare-board fixtures resemble FIG. 4 and include regularly spaced spring probes 414 on a tester and long, solid test probes 402 and 416 inserted through several layers of guide plates 400 drilled with small through-holes and held in a spaced-apart fashion with spacers 410. The bed of standard spring probes 414 actuate the solid test probes 402 and 416. The long, solid probes may be inserted into the guide plates vertically or at an angle in order to facilitate an easy transition between the fine-pitch, or very close, spacing of testpads 404 and 406 on the PCB side of the fixture and the larger-pitch spacing of the spring probes on the tester side of the fixture. One such bare-board fixture is disclosed in U.S. Pat. No. 5,493,230 titled "Retention of Test Probes in Translator Fixtures" to Swart et al., which is incorporated herein for all that it teaches.

Existing bare-board fixtures can consistently hit test targets equal to or greater than 20 mils in diameter with equal to or greater than 20-mil pitch (center-to-center spacing). Unfortunately, it is not possible to use bare-board fixtures directly on a loaded-board tester because there are many unique features which render bare-board test equipment directly incompatible with loaded-board test equipment.

Bare-board fixtures are not designed to accommodate PCBs which are populated with electronic components; only PCB features which are flush with respect to the PCB (pads, vias, and plated through holes) can be probed. Bare-board testers are used to determine the connectivity and continuity of test points and circuitry in a PCB. Unlike bare-board testers, loaded-board testers cannot tolerate higher electrical resistance between a target on a PCB and the tester electronics. Loaded-board fixtures must provide low-resistance connections and interfaces between targets, fixture components, and tester electronics. Unlike loaded-board testers, bare-board testers cannot determine whether a component or a group of components exists and functions properly.

The spacing of bare-board testhead interface probes is approximately 0.050 inches by 0.050 inches or 0.100 inches by 0.100 inches, while the spacing of Hewlett-Packard's testhead interface probes is approximately 0.150 inches by 0.350 inches. The probe spacing of bareboard fixtures which are designed to fit on bare-board testers is not compatible with the interface probe spacing of Hewlett-Packard's loaded-board tester. Bare-board fixtures translate a target on the PCB under test to the nearest interface probe in the bare-board tester. However, loaded-board testhead resources must be uniquely assigned and linked to specific targets and circuits. In loaded-board testing, the nearest interface probe may not be appropriate for a given target. Bare-board fixtures are not able to provide unique electrical routing to adjacent, nonadjacent, and remote testhead resources; cannot reach remote resources; and cannot provide the complex, loaded-board resource routing patterns required by a loaded printed circuit board.

The term "no-clean" refers to the non-conductive solder flux residue which remains on printed circuit assemblies after components have been attached. Unless this contamination is removed, no-clean targets, or targets which are coated with this non-conductive surface residue, provide poor electrical contact and are difficult to test. Furthermore, industry trends, such as smaller component packaging and denser PCBs, are forcing electronics'manufacturers to confront smaller center-to-center target spacing, and small-diameter targets. These challenges require an improved loaded-board test fixture that is capable of providing reliable, consistent in-circuit and circuit functional testing of printed circuit assemblies by probing the smaller, more closely spaced targets on today's no-clean, loaded printed circuit boards, while at the same time probing vias and testpads on loaded-boards with top and bottom-side components and testing for electrical connectivity, voltage, resistance, capacitance, inductance, circuit function, device function, polarity, vector testing, vectorless testing, and circuit functional testing.

Loaded-board equipment manufacturers and fixture builders have designed several accessories and products to improve the testability of small, fine-pitch targets, but no design has completely solved the physical and electrical contact problems, while remaining competitively priced and easy to build and maintain. Furthermore, because many printed circuit assemblies contain targets of various sizes and spacings, which may or may not require the precision that limited-access fixtures provide, high-accuracy fixtures composed entirely of limited-access fixturing technology may be costly and unnecessary. Therefore, it would be desirable to have a hybrid fixture that can accommodate both standard- and limited-access test targets.

There is a need for an improved loaded-board, guided-probed test fixture that solves physical and electrical problems related to limited-access and no-clean testing, is competitively priced, accommodates the sophisticated resource assignments required by loaded-board testing, and is relatively easy and inexpensive to build and maintain. There is a further need for such an improved loaded-board, guided-probe test fixture that has improved probing accuracy, improved no-clean testability, and improved fine-pitch probing ability. There is a further need in the art for a hybrid fixture that permits the probing of both standard and limited-access targets.

SUMMARY OF THE INVENTION

In accordance with the present invention there is provided a loaded-board fixturing system for interfacing a printed circuit board having electronic devices at predetermined locations thereon to one or more probe-mounting plates having electrical contacts at predetermined locations corresponding to the locations of the electronic devices on the printed circuit board. In one embodiment, the loaded-board fixturing system comprises: a hybrid guided-probe test system consisting of a device under test (DUT) with outer-layer artwork and electronic components, some method of DUT-to-fixture alignment, several guide plates with unique drilled through-hole patterns, test probes whose tips exactly correspond to test target locations, and shortwire fixture components which provide complex signal routing between the solid test probes and the interface probes in the tester. Long, leaning or vertical test probes are used in order to facilitate an easy transition between the fine-pitch spacing of the targets on the DUT side of the fixture and the larger-pitch spring probes on the probe mounting plate on the opposite side of the fixture. Short spring probes installed in the top guide plate are used to probe standard-access targets located on the DUT.

The hybrid guided-probe test fixture of the present invention utilizes long, leaning or vertical test probes, probe-guiding plates and limited probe tip travel to achieve high-accuracy, fine-pitch probing. The hybrid guided-probe test fixture of the present invention utilizes short spring probes installed in the top guide plate in order to probe standard-access targets. The hybrid guided-probe test fixture of the present invention utilizes spring probes, a probe mounting plate, personality pins, and an alignment plate to couple test targets with multiplexed tester interface probes of a loaded-board tester.

In addition, the ability of the system to probe no-clean targets is enhanced by high spring force probes and the wiping or scraping of the tips of leaning probes across the targets during actuation. The hybrid test fixture of the present invention has improved probing accuracy due to reduced fixture and component tolerances, improved no-clean testability due to the probe wiping action (the wiping of the tips of the solid probes across the targets) and high spring force probes, improved ability to probe fine-pitch targets due to reduced component dimensions, and inexpensive probing of standard-access targets due to the use of off-the-shelf fixture components. Problems associated with leaning probes, such as probing inaccuracy and probe tip wear, are also minimized by the presence of non-leaning, standard-access spring probes in the hybrid test fixture of the present invention.

BRIEF DESCRIPTION OF THE DRAWINGS

The above and other objects, features and advantages of the present invention will be better understood by reading the following more particular description of the invention, presented in conjunction with the following drawings, wherein.

DETAILED DESCRIPTION OF THE PREFERRED EMBODIMENTS

Figure 1:
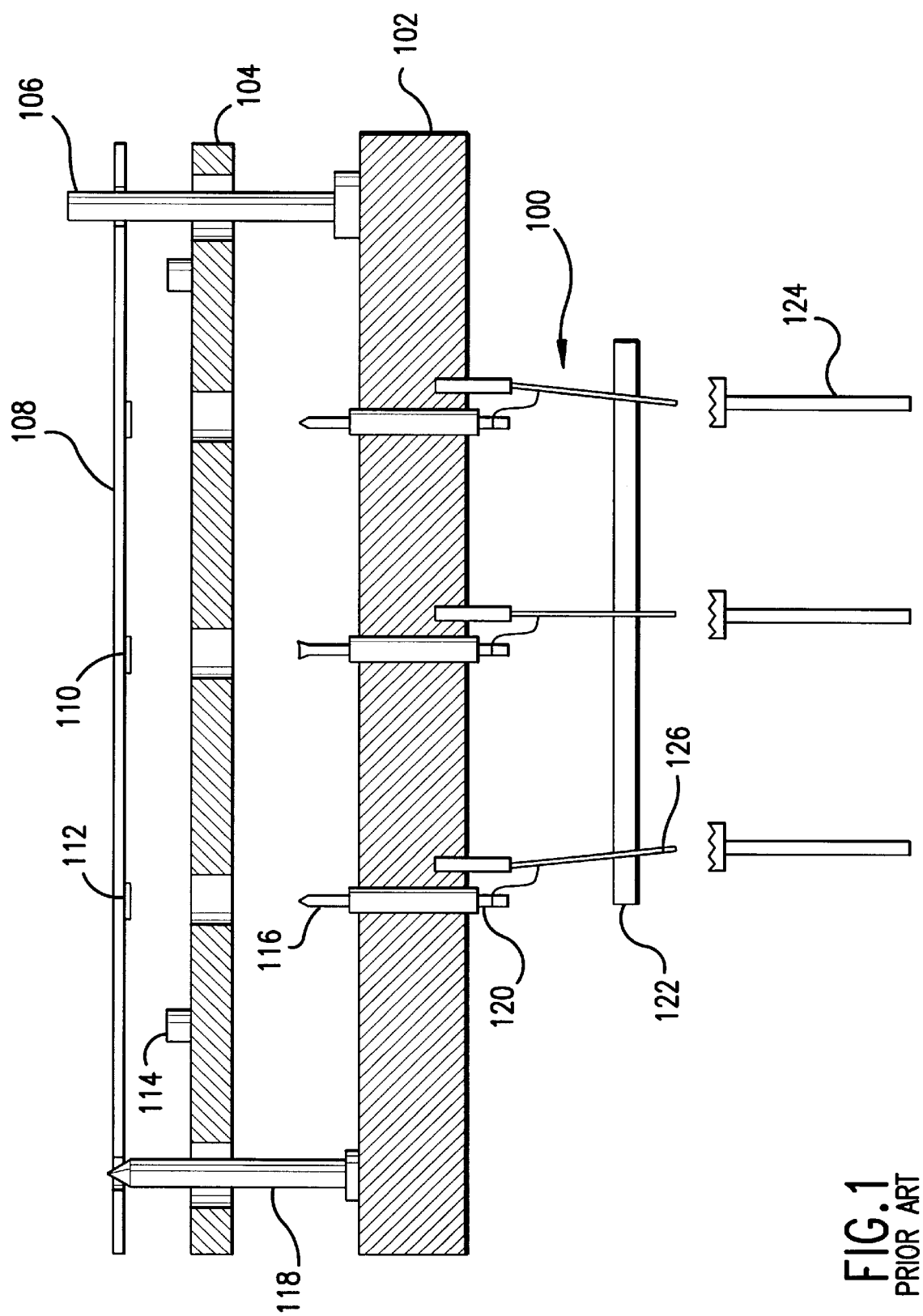
FIG. 1 shows a cut-away view of a conventional shortwire test fixture.
Figure 2:
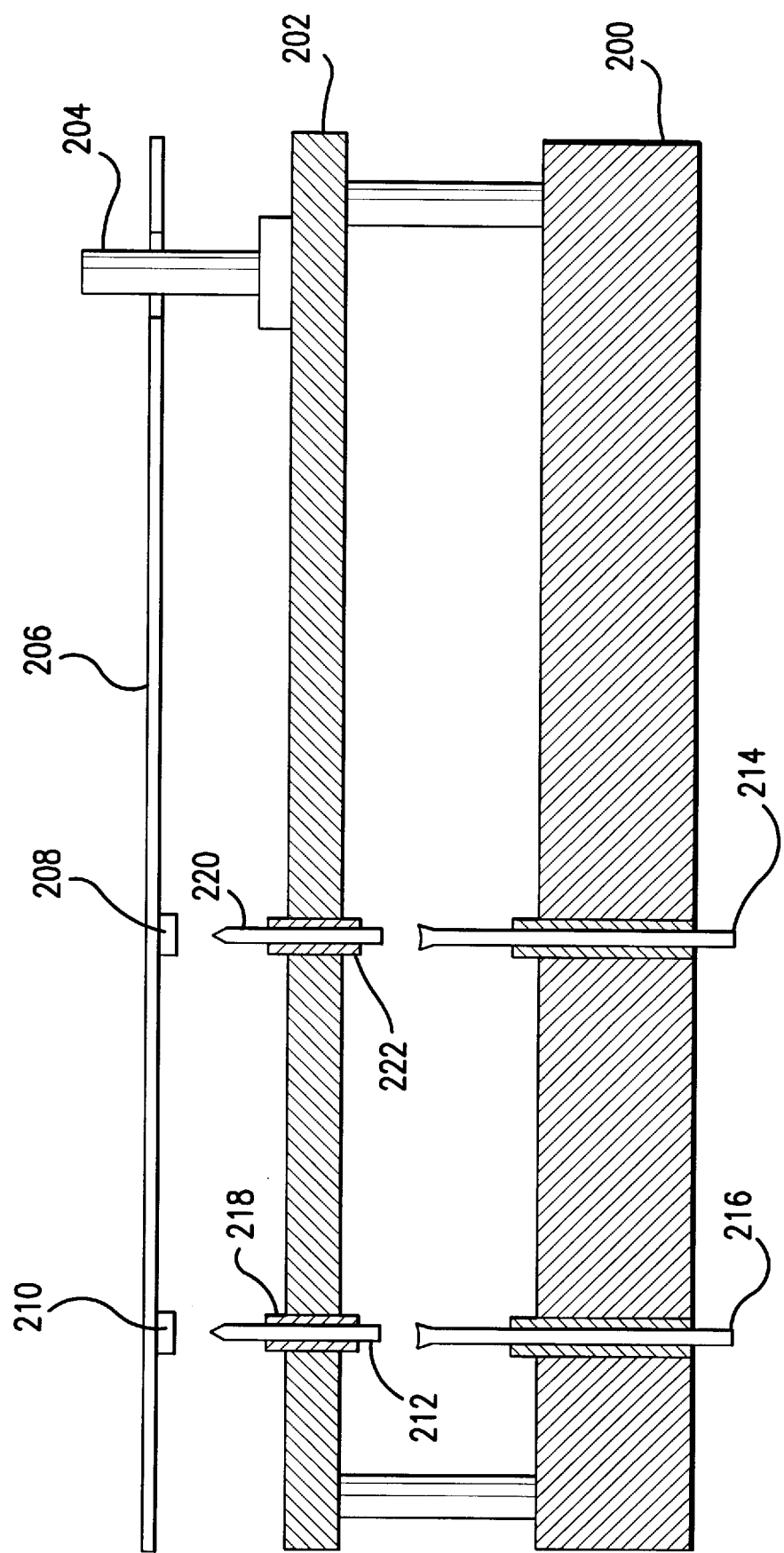
FIG. 2 shows a cut-away view of a conventional "ULTRALIGN" test fixture.
Figure 3:
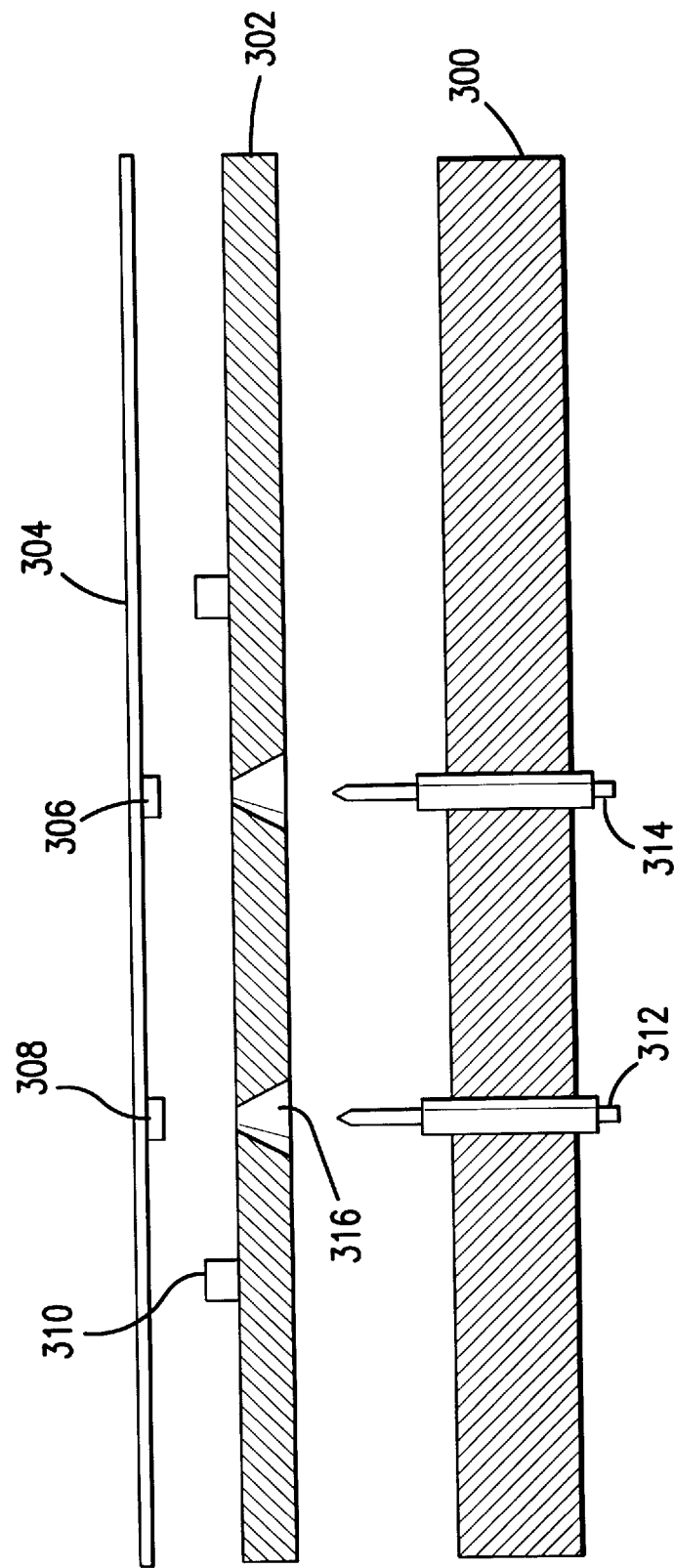
FIG. 3 shows a cut-away view of a conventional guided-probe protection plate.
Figure 4:
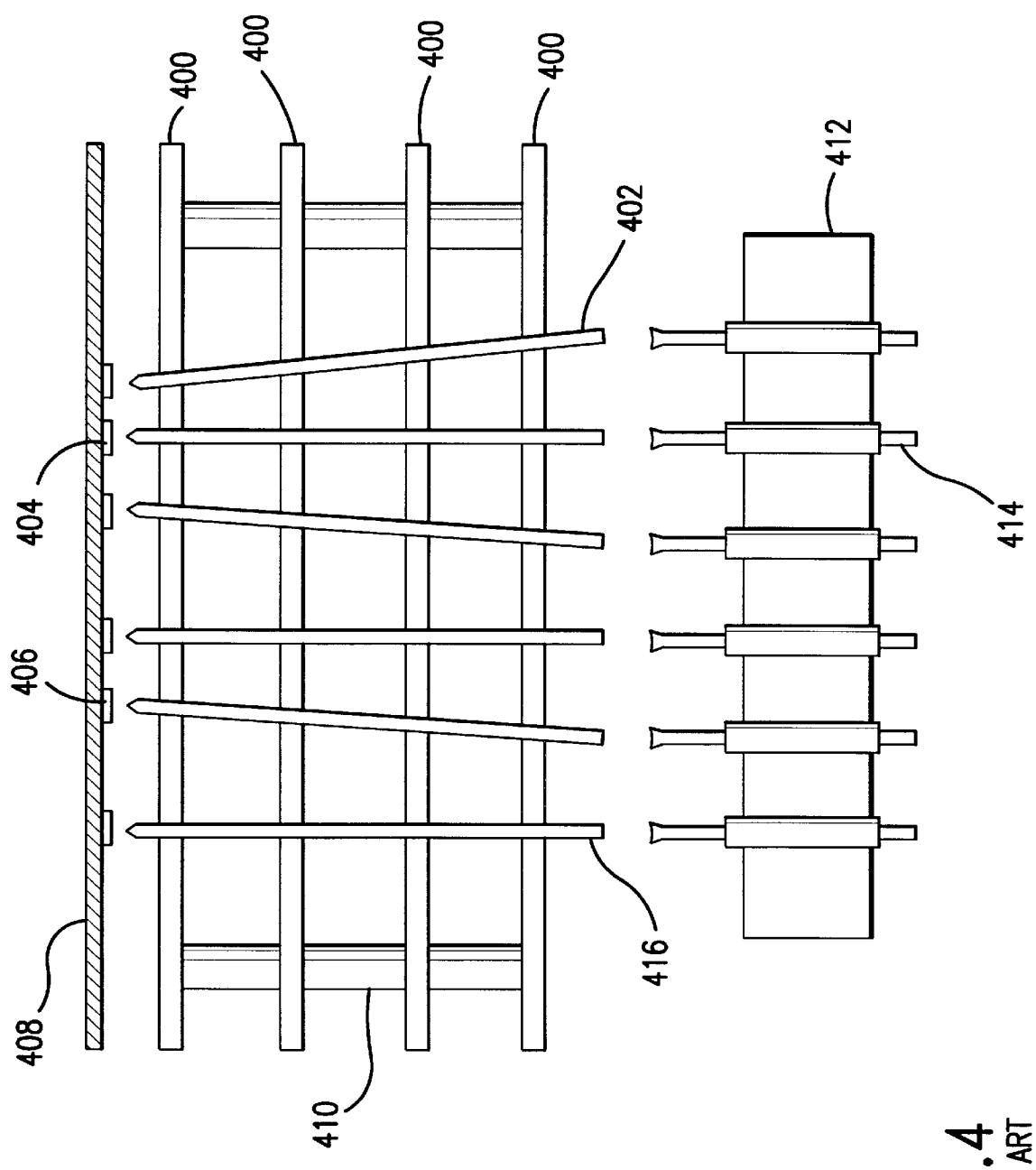
FIG. 4 shows a cut-away view of a conventional bare-board translator test fixture.
Figure 5:
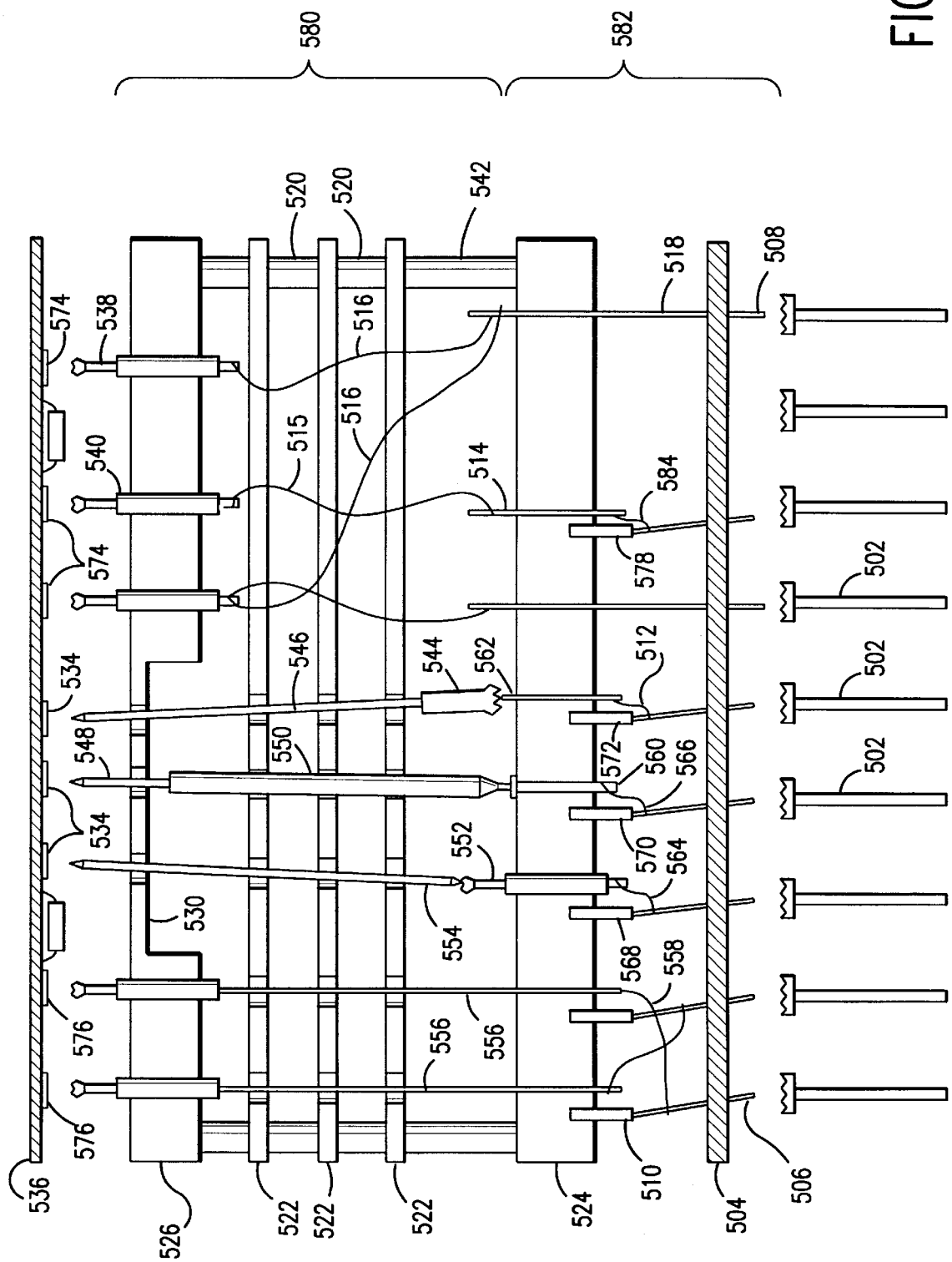
FIG. 5 shows a cut-away view of a hybrid, loaded-board, guided-probe test fixture capable of probing both standard- and limited-access test targets according to the present invention.

Referring to the schematic block diagram of FIG. 5, a hybrid, loaded-board, guided-probe test fixture 500 capable of probing both standard- and limited-access test targets according to the present invention is illustrated. The test fixture of the present invention comprises two major assemblies. The first assembly 580 is a translator fixture comprising a series of vertically spaced-apart and parallel guide plates 522, which are supported in parallel by solid posts 520 that hold the fixture together as a solid unit. The fixture includes a top guide plate 526 with spring probes 532, 538 and 540 installed therein for accessing standard-access targets 574 and 576 on the DUT 536. The second major assembly of the present invention is the unit of a probe mounting plate 524 and an alignment plate 504.

Limited access targets 534 are accessed by any of various types of long, leaning test probes 546, 548 and 554 that extend through guide holes in the translator guide plates 522. The top guide plate 526 is counter bored or milled at various locations 530 on the side opposite the DUT 536 in order to optimize leaning probe geometries and to enhance the probing accuracy of the bare-board fixture components. The long test probes 546, 548 and 554 are characterized by their ability to facilitate an easy transition from the fine-pitch targets 534 on the device under test 536 to larger-pitch targets on the probe-mounting plate 524. The larger-pitch targets 552, 560 and 562 on the probe-mounting plate 524 are used to electrically connect test probes 546, 548 and 554 to personality pins 568, 570 and 572 in the probe-mounting plate 524. Probe-mounting plates are well known in the art: one such plate being a probe-mounting plate made of glass-reinforced epoxy.

Test probe 554 includes a solid test probe resting atop and actuated by a spring probe 552 installed in probe mounting plate 524. Spring probe 552 extends through the probe-mounting plate 524 from the first side which faces the translator fixture 580 to a second side which faces an alignment plate 504. Spring probe 552 is electrically connected to personality pin 568 on the second side of the probe-mounting plate 524 by means of wirewrap 564. Personality pin 568 is embedded in the second side of the probe-mounting plate 524. A long wirewrap post of personality pin 568 extends through holes in an alignment plate 504 to make contact with interface probes 502 to the tester (not shown). Interface probes 502 of the tester are in a predetermined fixed, regularly spaced grid pattern. The alignment plate 504 aligns the wirewrap post of personality pin 568 to the predetermined location of a corresponding interface pin 502 of the tester.

Test probe 548 includes a probe plunger extending from within a spring probe assembly that includes barrel and/or socket 550 with a spring inside of it. Test probe 548 sits atop a personality peg 560 that is installed in probe-mounting plate 524. Personality peg 560 extends through the probe-mounting plate 524 from the first side which faces the translator fixture 580 to a second side which faces an alignment plate 504. Personality peg 560 is electrically connected to personality pin 570 on the second side of the probe-mounting plate 524 by means of wirewrap 566. Personality pin 570 is embedded in the second side of the probe-mounting plate 524. A long wirewrap post of personality pin 570 extends through a hole in an alignment plate 504 to make contact with interface probes 502 to the tester (not shown). The alignment plate 504 aligns the wirewrap post of personality pin 570 to the predetermined location of a corresponding interface pin 502 of the tester.

Test probe 546 includes a probe plunger extending from within a waffle-ended spring probe assembly which rests atop a personality post 562 installed in probe-mounting plate 524. Personality post 562 extends through the probe-mounting plate 524 from the first side which faces the translator fixture 580 to a second side which faces an alignment plate 504. Personality post 562 is electrically connected to personality pin 572 on the second side of the probe-mounting plate 524 by means of wirewrap 512. Personality pin 572 is embedded in the second side of the probe-mounting plate 524. A long wirewrap post of personality pin 572 extends through a hole in alignment plate 504 to make contact with interface probes 502 to the tester (not shown). The alignment plate 504 aligns the wirewrap post of personality pin 572 to the predetermined location of a corresponding interface pin 502 of the tester.

The long test probes 546, 548 and 554 are in alignment on a first side of the translator fixture 580 with limited-access test targets 534 of a loaded-board 536. The test probes 546, 548 and 554 are in alignment on a second side of the translator fixture 580 with personality post 562, personality peg 560 and spring probe 552, respectively. The spring probe 552 of limited-access test probe 554, the personality peg 560 of limited-access test probe 548, and the personality post 562 of limited-access test probe 546 can be installed at specific predetermined depths within the probe-mounting plate 524 in order to accommodate unique probe and target geometries and heights.

The personality pin 572, the personality peg 560, and the personality post 562 are unique components. The personality pin 572 is installed in the bottom side of the probemounting plate and possesses a metal tail which can accept sockets or wirewrap. Both the personality peg 560 and the personality post 562 extend through the probe-mounting plate. The personality peg 560 conducts electricity and possesses a large head which is suitable for contact with a sharp object and a tail which can accept sockets or wirewrap. The personality post 562 also conducts electricity, but possesses a small head and a tail which can accept sockets or wirewrap.

Standard-access targets 574 and 576 are accessed by spring probes 532, 538 and 540 that are installed in top guide plate 526 of translator fixture 580. Spring probes 532, 538 and 540 are electrically connected to interface probes 502 of the tester in one of the following methods.

First, a spring probe 532 may have a long, wirewrap tail 556 that extends through holes in guide plates 522 and the probe-mounting plate 524. The long, wirewrap tails 556 are electrically connected to personality pins 510 on the second side of the probe-mounting plate 524 by means of wirewrap 558. Personality pins 510 are embedded in the second side of the probe-mounting plate 524. A long wirewrap post of personality pins 510 extend through holes in alignment plate 504 to make contact with interface probes 502 to the tester (not shown). Alignment plate 504 aligns the wirewrap posts of personality pins 510 to the predetermined location of a corresponding interface pin 502 of the tester.

A spring probe 540 may have a long wirewrap 515 that is routed through guide plates 522 and wire-wrapped to personality post 514 that is embedded in probe-mounting plate 524. Personality post 514 extends through the probe-mounting plate 524 from the first side which faces the translator fixture 580 to a second side which faces an alignment plate 504. Personality post 514 is electrically connected to personality pin 578 on the second side of the probe-mounting plate 524 by means of wirewrap 584. Personality pin 578 is embedded in the second side of the probe-mounting plate 524. A long wirewrap post of personality pin 578 extends through a hole in alignment plate 504 to make contact with interface probes 502 to the tester (not shown). The alignment plate 504 aligns the wirewrap post of personality pin 578 to the predetermined location of a corresponding interface pin 502 of the tester.

A spring probe 538 may have a long wirewrap 516 that is routed through guide plates 522 and wire-wrapped to long personality post 518 that is embedded in probe-mounting plate 524. Personality post 518 extends through the probe-mounting plate 524 from the first side which faces the translator fixture 580 to a second side which faces an alignment plate 504 and extends through a hole in alignment plate 504 to make contact with interface probes 502 to the tester (not shown). The alignment plate 504 aligns the personality post 518 to the predetermined location of a corresponding interface pin 502 of the tester.

Accurate alignment of the test fixture is essential for reliable operation. Alignment for the DUT 536 to the translator fixture 580 is maintained by means of tooling pins (not shown), which is well known in the art of board test. Alignment between the translator fixture 580 and the probe-mounting plate 524 is maintained by means of alignment pins (not shown) or other known means. Alignment between the alignment plate 504 and the interface probes 500 is controlled through the mounting and locking hardware well known in the art of loaded-board test.

The method of operation of the test fixture is as follows. The translator assembly 580 is mounted on the probe-mounting plate/alignment plate assembly 582. The entire fixture, which includes the translator fixture 580 and the probe-mounting plate/alignment plate assembly 582 is then mounted on the regularly spaced grid of interface probes 502 on the tester. Next the loaded printed circuit board 536 to be tested is placed on the translator fixture assembly 580 by means of tooling pins (not shown). The test targets 534, 574 and 576 of the loaded-printed circuit board 536 are then brought into contact with the test probes 532, 538, 540, 546, 548 and 554 of the translator fixture assembly 580 by any of several known means, including vacuum, pneumatic or mechanical actuating means.

As the printed circuit board 536 is drawn toward the tester (not shown), the long test probes 554, 548 and 546 are sandwiched between the test targets 534 of the DUT 536 and spring probe assembly 552, spring probe assembly 550, and waffle-ended spring probe assembly 544, respectively, thus making a good, low-resistance contact between the tips of the long test probes 554, 548 and 546 and the limited-access test targets 534. The spring force of the spring probe assembly 552, spring probe assembly 550 and waffle-ended spring probe assembly 544 helps the tips of test probes 554, 548 and 546 make a good contact with the test targets 534, even if there is flux residue left on the printed circuit board due to existing noclean, loaded-board manufacturing processes.

As the printed circuit board 536 is drawn toward the tester (not shown), the spring force of standard-access test probes 532, 538 and 540 helps to make a good, low-resistance contact between the tips of the standard-access test probes 532, 538 and 540 and the standardaccess test targets 576 and 574. Once electrical contact between the DUT and the various corresponding test probes is established, in-circuit or circuit functional testing may commence.

There are actually two anticipated methods to initiate full electrical contact between the test targets and the interface probes on the tester. One method involves placing the DUT 536 directly on the tips of the test probes and then pushing the DUT 536 and the translator fixture 580 toward the unit 582 of the hybrid fixture, consisting of the probe-mounting plate 524 and the alignment plate 504, where the translator fixture portion 580 of the hybrid fixture and the probe-mounting plate/alignment plate portion 582 of the hybrid fixture are aligned with tooling pins, but can move in the vertical direction in relation to each other. The second method involves placing the DUT 536 directly on the tips of the test probes and then pushing the DUT 536 towards the entire hybrid fixture, where the translator portion 580 and the probe-mounting plate/alignment plate portion 582 are fixedly secured to one another by spacers 542.

The proposed hybrid test fixture of the present invention can probe a mixture of standard-access 574 and 576 and limited-access targets 534. Long, leaning test probes 546, 548 and 554, guide plates 522 and limited probe tip travel improve the test fixture's ability to probe small, fine-pitch targets 534. Spring probes 550, 552 and 544, wirewrap 564, 566 and 512, personality pins 510, 568, 570, 572 and 578, and alignment plate 504 provide complex tester resource allocation.

The foregoing description of the present invention has been presented for purposes of illustration and description. It is not intended to be exhaustive or to limit the invention to the precise form disclosed, and other modifications and variations may be possible in light of the above teachings. For example, probe-mounting plate 524 could be replaced with a wireless PCB for connecting the test probes with the interface probes 502. Moreover, the translator fixture could be milled out to accommodate even more types of test probes, such as the larger capacitive and inductive type test probes. Solid test probes is meant to include flexing test probes as well as rigid test probes. Also, two hybrid test fixtures of the present invention could be used in a clamshell type tester in order to test printed circuit boards that are populated with electronic components on both sides or have test targets on both sides.

Still further, the hybrid test fixture of the present invention could be used in conjunction with an automatic tester in order to test printed circuit boards that are populated with electronic components on both sides or have test targets on both sides. Moreover, different types of test probes could be utilized in the test fixture of the present invention. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A hybrid test fixture for electrically connecting one or more limited-access test targets and one or more standard-access test targets on a loaded-board device under test with interface probes of a tester, said hybrid test fixture comprising:

a) one or more long test probes;

b) a plurality of substantially parallel guide plates having at least a top guide plate and a bottom guide plate, said plurality of substantially parallel guide plates having through holes in predetermined locations, such that each of said one or more long test probes extend through said through holes in said guide plates and line up with a corresponding one of said one or more test targets;

c) one or more spring probes mounted in said top guide plate such that said each of said one or more spring probes lines up with a corresponding one of said one or more standardaccess test targets;

d) a probe-mounting plate between said plurality of guide plates and said interface probes of said tester when said hybrid test fixture is mounted on said tester;

e) a plurality of personality pins having wirewrap posts mounted in said probemounting plate, each of said personality pins being electrically connected to at least one of said one or more long test probes and at least one of said one or more spring probes; and f) an alignment plate, said wirewrap posts of said personality pins extending through said alignment plate in such a manner that each of said wirewrap posts lines up with a corresponding interface pin of said tester when said hybrid test fixture is mounted on said tester.

2. The hybrid test fixture according to claim 1 wherein said long test probes are long, solid test probes, said long, solid test probes being electrically connected to said personality pins by means of spring probes mounted in and extending through said probe-mounting plate, said spring probe mounted in said probe-mounting plate being wire-wrapped to at least one of said wirewrap posts of said personality pins mounted in said probe-mounting plate, said spring probes mounted in said probe-mounting plate actuating said long, solid test probes in contact with corresponding test targets on said device under test.

3. The hybrid test fixture according to claim 1 wherein said long test probes include a probe plunger and a spring probe assembly having a barrel or socket, wherein said probe plunger extends through holes in said plurality of guide plates and contacts a corresponding test target, said spring probe assembly is electrically connected to said personality pin by means of a personality peg mounted in and extending through said probe-mounting plate, said personality peg being wire-wrapped to at least one of said wirewrap posts of said personality pins mounted in said probe-mounting plate, said spring probe assembly being in contact with said personality peg, said probe plunger being in contact with said spring probe assembly at one end and a corresponding test target at the other end.

4. The hybrid test fixture according to claim 1 wherein said long test probes include a probe plunger and a waffle-ended spring probe assembly, wherein said probe plunger extends through holes in said plurality of guide plates and contacts a corresponding test target, said waffle-ended spring probe assembly is electrically connected to said personality pin by means of a personality post, said personality post being wire-wrapped to at least one of said wirewrap posts of said personality pins mounted in said probe-mounting plate, said waffle-ended spring probe assembly being in contact with said personality post, said probe plunger being in contact with said waffle-ended spring probe assembly at one end and a corresponding test target at the other end.

5. The hybrid test fixture according to claim 1 wherein said spring probes mounted in said top guide plate are electrically connected to said personality pins by means of long wirewrap tails extending from said spring probes mounted in said top guide plate through said guide plates, said long wirewrap tail extends through said probe-mounting plate and is wire-wrapped to said wirewrap post of said personality pin.

6. The hybrid test fixture according to claim 1 wherein said spring probes mounted in said top guide plate are electrically connected to said personality pins by means of wires that extend through said guide plates, said wirewrap extends through said probe-mounting plate and is connected to said wirewrap posts of said personality pins.

7. A hybrid test fixture for electrically connecting one or more limited-access test targets and one or more standard-access test targets on a loaded-board device under test with interface probes of a tester, said hybrid test fixture comprising:
  a) one or more long test probes;
  b) a plurality of substantially parallel guide plates having at least a top guide plate and a bottom guide plate, said plurality of substantially parallel guide plates having through holes in predetermined locations, such that each of said long test probes extend through said through holes in said guide plates and lines up with a corresponding one of said one or more limited-access test targets;
  c) one or more spring probes mounted in said top guide plate such that said each of said spring probes lines up with a corresponding one of said one or more standard-access test targets;
  d) a probe-mounting plate between said plurality of guide plates and said interface probes of said tester when said hybrid test fixture is mounted on said tester;
  e) one or more personality posts mounted in and extending through said probe-mounting plate, each of said personality posts being electrically connected to at least one of said one or more long test probes and said one or more spring probes; and
  f) an alignment plate, said one or more personality posts extending through said alignment plate in such a manner that each of said one or more personality posts lines up with a corresponding interface pin of said tester when said hybrid test fixture is mounted on said tester.

8. The hybrid test fixture according to claim 7 wherein said spring probes mounted in said top guide plate are electrically connected to said personality posts by means of wires that extend through said guide plates, said wirewrap being connected to said wirewrap posts of said personality pins.

9. A hybrid test fixture for electrically connecting one or more limited-access test targets and one or more standard-access test targets on a loaded-board device under test with interface probes of a tester, said hybrid test fixture comprising:
  a) one or more long test probes;
  b) a plurality of substantially parallel guide plates having at least a top guide plate and a bottom guide plate, said plurality of substantially parallel guide plates having through holes in predetermined locations, such that each of said long test probes extend through said through holes in said guide plates and lines up with a corresponding one of said one or more limited-access test targets;
  c) one or more spring probes mounted in said top guide plate such that said each of said one or more spring probes lines up with a corresponding one of said one or more standardaccess test targets;
  d) a probe-mounting plate between said plurality of guide plates and said interface probes of said tester when said hybrid test fixture is mounted on said tester;
  e) one or more personality pins having wirewrap posts and personality posts mounted in said probe-mounting plate, each of said personality pins and said personality posts being electrically connected to at least one of said one or more long test probes and said one or more spring probes; and
  f) an alignment plate, one or more of said wirewrap posts of said one or more personality pins and said one or more personality posts extending through said alignment plate in such a manner that each of said one or more wirewrap posts and each of said one or more personality posts lines up with a corresponding interface pin of said tester when said hybrid test fixture is mounted on said tester.

10. The hybrid test fixture according to claim 9 wherein said one or more long test probes are one or more long, solid test probes, said one or more long, solid test probes being electrically connected to said one or more personality pins by means of one or more spring probes mounted in and extending through said probe-mounting plate, said one or more spring probes mounted in said probe-mounting plate being wire-wrapped to at least one of said wirewrap posts of said one or more personality pins mounted in said probe-mounting plate, said one or more spring probes mounted in said probe-mounting plate actuating said one or more long, solid test probes in contact with corresponding test targets on said device under test.

11. The hybrid test fixture according to claim 9 wherein said one or more long test probes include a probe plunger and a spring probe assembly having a barrel or socket, wherein said probe plunger extends through holes in said plurality of guide plates and contacts a corresponding test target, said spring probe assembly is electrically connected to said personality pin by means of a personality peg mounted in and extending through said probemounting plate, said personality peg being wire-wrapped to at least one of said wirewrap posts of said one or more personality pins mounted in said probe-mounting plate, said spring probe assembly being in contact with said personality peg, said probe plunger being in contact with said spring probe assembly at one end and a corresponding test target at the other end.

12. The hybrid test fixture according to claim 9 wherein said one or more long test probes include a probe plunger and a waffle-ended spring probe assembly, wherein said probe plunger extends through holes in said plurality of guide plates and contacts a corresponding test target, said waffle-ended spring probe assembly is electrically connected to said personality pin by means of a personality post, said personality post being wire-wrapped to at least one of said wirewrap posts of said one or more personality pins mounted in said probe-mounting plate, said waffle-ended spring probe assembly being in contact with said personality post, said probe plunger being in contact with said waffle-ended spring probe assembly at one end and a corresponding test target at the other end.

13. The hybrid test fixture according to claim 9 wherein said one or more spring probes mounted in said top guide plate are electrically connected to said one or more personality pins by means of long wirewrap tails extending from said one or more spring probes mounted in said top guide plate through said guide plates, said long wirewrap tails extending through said probe-mounting plate and wire-wrapped to said wirewrap post of said one or more personality pins.

14. The hybrid test fixture according to claim 9 wherein said one or more spring probes mounted in said top guide plate are electrically connected to said one or more personality pins by means of wire connected to said one or more spring probes and extending through said guide plates, said wire extends through said probe-mounting plate and is connected to said wirewrap posts of said one or more personality pins.

* * * * *